United States Patent
Ishihara et al.

(10) Patent No.: US 8,705,035 B2
(45) Date of Patent: Apr. 22, 2014

(54) TARGET GENERATION DEVICE

(71) Applicant: Gigaphoton Inc., Oyama (JP)

(72) Inventors: Takanobu Ishihara, Oyama (JP); Tamotsu Abe, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/744,334

(22) Filed: Jan. 17, 2013

(65) Prior Publication Data

US 2013/0186976 A1    Jul. 25, 2013

(30) Foreign Application Priority Data

Jan. 23, 2012   (JP) .................................. 2012-011381
Nov. 26, 2012  (JP) .................................. 2012-257635

(51) Int. Cl.
*G01N 21/00*    (2006.01)

(52) U.S. Cl.
USPC ........................................................ 356/432

(58) Field of Classification Search
USPC ........................................................ 356/432
See application file for complete search history.

(56) References Cited

U.S. PATENT DOCUMENTS

| | | | |
|---|---|---|---|
| 6,882,704 B2 * | 4/2005 | Schriever et al. | 378/119 |
| 7,838,854 B2 | 11/2010 | Algots et al. | |
| 2004/0135517 A1 * | 7/2004 | Schriever et al. | 315/111.21 |
| 2013/0062538 A1 * | 3/2013 | Kodama et al. | 250/504 R |

* cited by examiner

*Primary Examiner* — Roy M Punnoose
(74) *Attorney, Agent, or Firm* — McDermott Will & Emery LLP

(57) ABSTRACT

A device for determining a target generation condition for a target generator which is driven by a pulse voltage to generate a droplet of a target material may include a detector configured to detect a target generated by the target generator and output a detection signal of the target, and a controller configured to control a pulse duration of the pulse voltage for driving the target generator. The controller can determine whether or not a target is generated by the target generator based on the detection signal, and determine whether or not the generated target includes a plurality of droplets based on the detection signal.

4 Claims, 14 Drawing Sheets

| | CONDITION A | CONDITION B | CONDITION C |
|---|---|---|---|
| TARGET DIAMETER D OF TARGET 27 (μm) | 36 | 29 | 19 |
| TARGET MATERIAL | TIN (Sn) | TIN (Sn) | TIN (Sn) |
| TEMPERATURE OF RESERVOIR 61 (°C) | 290 | 290 | 290 |
| PRESSURE OF INERT GAS TO BE SUPPOED INTO RESERVOIR 61 FROM PRESSURE ADJUSTER 53 (kPa) | 401 | 401 | 401 |
| DISTANCE FROM PROTRUSION 62 TO PULL-OUT ELECTRODE 66 (mm) | 0.7 | 0.7 | 0.7 |
| DIAMETER OF THROUGH-HOLE IN NOZZLE PLATE 62 (μm) | 6 | 6 | 6 |
| DC POTENTIAL APPLIED TO PULL-OUT ELECTRODE 66 FROM DC VOLTAGE POWER SUPPLY 57 (kV) | 5.8 | 5.8 | 6.5 |
| PULSE POTENTIAL APPLIED TO PULL-OUT ELECTRODE 66 FROM PULSE VOLTAGE POWER SUPPLY 58 (Kv) *1 | 3-0 | 3-0 | 3-0 |
| REPETITION RATE OF PULSE VOLTAGE APPLIED TO PULL-OUT ELECTRODE 66 (kHz) | 0.1 | 0.2 | 0.4 |

*1 "3-0" INDICATES PULSE POTENTAIL WHERE BIAS VALUE IS 0 V AND PEAK VALUE IS 3 kV.

FIG. 4D

TARGET GENERATION DEVICE

CROSS-REFERENCE TO RELATED APPLICATIONS

The present application claims priority from Japanese Patent Application No. 2012-011381 filed Jan. 23, 2012 and Japanese Patent Application No. 2012-257635 filed Nov. 26, 2012.

BACKGROUND

1. Technical Field

The present disclosure relates to a device for generating targets.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

A device according to one aspect of the present disclosure for determining a target generation condition used with a target generator which is driven by a pulse voltage and generates a droplet of a target material may include a detector configured to detect a target generated by the target generator and output a detection signal of the target, and a controller configured to control a pulse duration of the pulse voltage for driving the target generator, determine whether or not a target is generated by the target generator based on the detection signal, and determine whether or not the generated target includes a plurality of droplets based on the detection signal.

BRIEF DESCRIPTION OF THE DRAWINGS

Hereinafter, selected embodiments of the present disclosure will be described with reference to the accompanying drawings.

FIG. 4D is a table showing driving conditions of a target generator when the results shown in FIGS. 4A through 4A are obtained.

DETAILED DESCRIPTION

Figure 1:
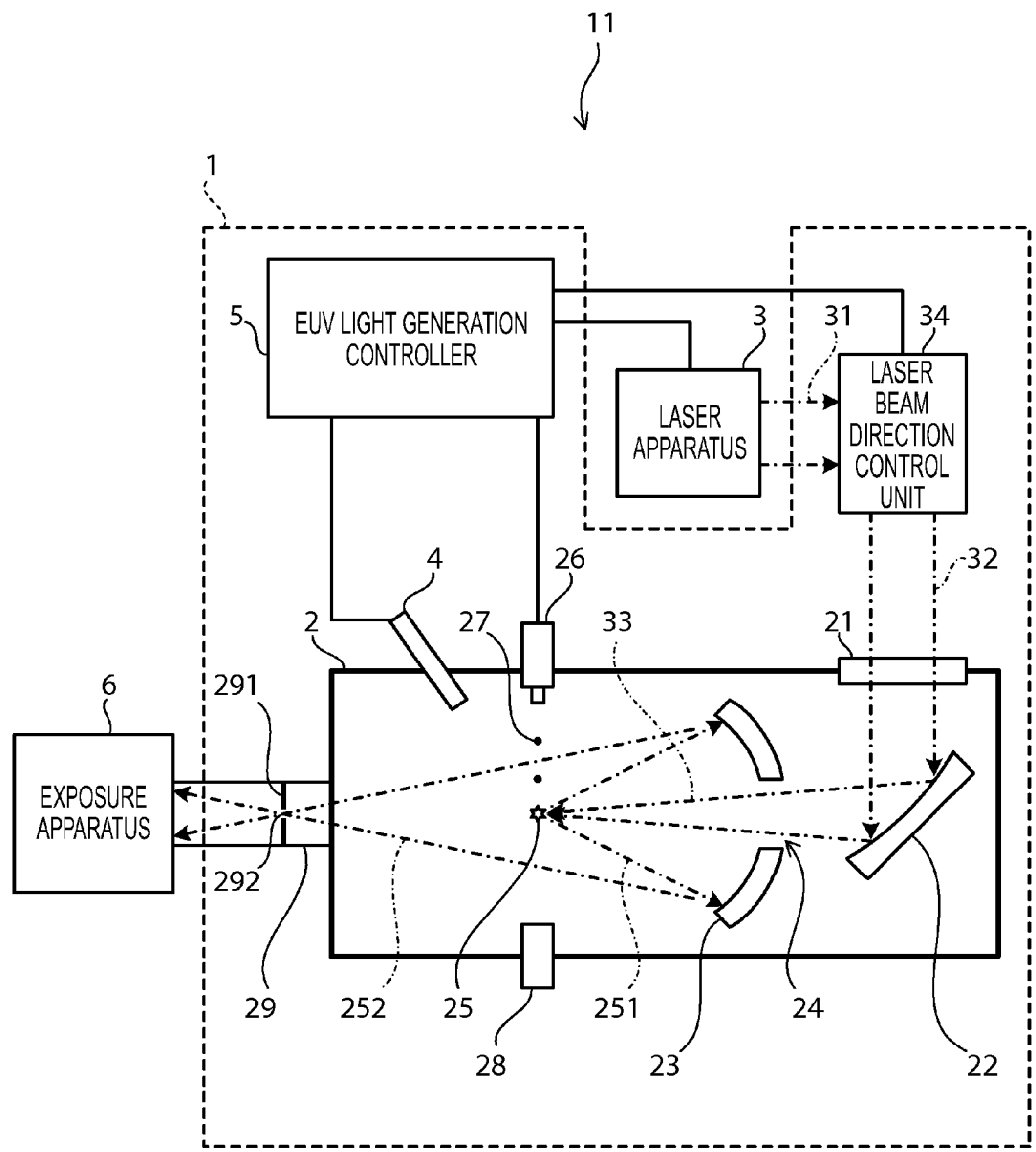
FIG. 1 schematically illustrates a configuration of an exemplary LPP-type EUV light generation system.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents
1. Overview
2. Overview of EUV Light Generation System
2.1 Configuration
2.2 Operation
3. EUV Light Generation Apparatus Including Target Generation Device: First Embodiment
3.1 Configuration
3.2 Operation
3.2.1 Output of Target and Pulse Laser Beam
3.2.2 Detection and Suppression of Satellite
3.2.3 Main Flow 3.2.4 Measurement of Satellite (Details of Step S300)
3.2.5 Determining Whether or Not to Re-Measure Satellite (Details of Step S800)
4. Target Generation Device: Second Embodiment
4.1 Configuration
4.2 Operation
5. EUV Light Generation Apparatus: Third Embodiment
5.1 Configuration
5.2 Operation
5.2.1 Main Flow
5.2.2 Determination of Pulse Duration (Details of Step S30)
6. Configuration of Controller

1. Overview

In an LPP type EUV light generation apparatus, a droplet of a target material may be generated and supplied by a target generator into a chamber. When the droplet of the target material is generated by the target generator, a satellite droplet (hereinafter, simply referred to as a satellite) may also be generated. Satellites do not contribute to generating EUV light, but may contaminate components inside the chamber. Accordingly, in one aspect of the present disclosure, satellites may be suppressed by controlling a pulse duration of a voltage applied to the target generator.

2. Overview of EUV Light Generation System 2.1 Configuration

FIG. 1 schematically illustrates a configuration of an exemplary laser produced plasma (LPP) type EUV light generation system. An LPP type EUV light generation apparatus 1 may be used with at least one laser apparatus 3. Hereinafter, a system that includes the EUV light generation apparatus 1 and the laser apparatus 3 may be referred to as an EUV light generation system 11. As illustrated in FIG. 1 and described in detail below, the EUV light generation system 11 may include a chamber 2 and a target generator 26. The chamber 2 may be airtightly sealed. The target generator 26 may be mounted onto the chamber 2 to, for example, penetrate a wall of the chamber 2. A target material to be supplied by the target generator 26 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may be provided inside the chamber 2. The EUV collector mirror 23 may have a multi-layered reflective film formed on the spheroidal surface thereof. The reflective film may include a molybdenum layer and a silicon layer, which are laminated alternately. The EUV collector mirror 23 may have a first focus and a second focus, and may be positioned such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, the trajectory, the position, and the speed of a target 27.

Further, the EUV light generation system 11 may include a connection part 29 for allowing the interior of the chamber 2 to be in communication with the interior of the exposure apparatus 6. A wall 291 having an aperture may be provided inside the connection part 29, and the wall 291 may be positioned such that the second focus of the EUV collector mirror 23 lies in the aperture formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

2.2 Operation

With continued reference to FIG. 1, a pulse laser beam 31 outputted from the laser apparatus 3 may pass through the laser beam direction control unit 34 and be outputted therefrom as a pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target generator 26 may be configured to output the target(s) 27 toward the plasma generation region 25 inside the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to control the overall operation of the EUV light generation system 11. The EUV light generation controller 5 may be configured to process image data of the target 27 captured by the target sensor 4. Further, the EUV light generation controller 5 may be configured to control at least one of the timing at which the target 27 is outputted and the direction into which the target 27 is outputted. Furthermore, the EUV light generation controller 5 may be configured to control at least one of the timing at which the laser apparatus 3 oscillates, the direction in which the pulse laser beam 31 travels, and the position at which the pulse laser beam 33 is focused. It will be appreciated that the various controls mentioned above are merely examples, and other controls may be added as necessary.

3. EUV Light Generation Apparatus Including Target Generation Device

First Embodiment 3.1 Configuration

Figure 2A:
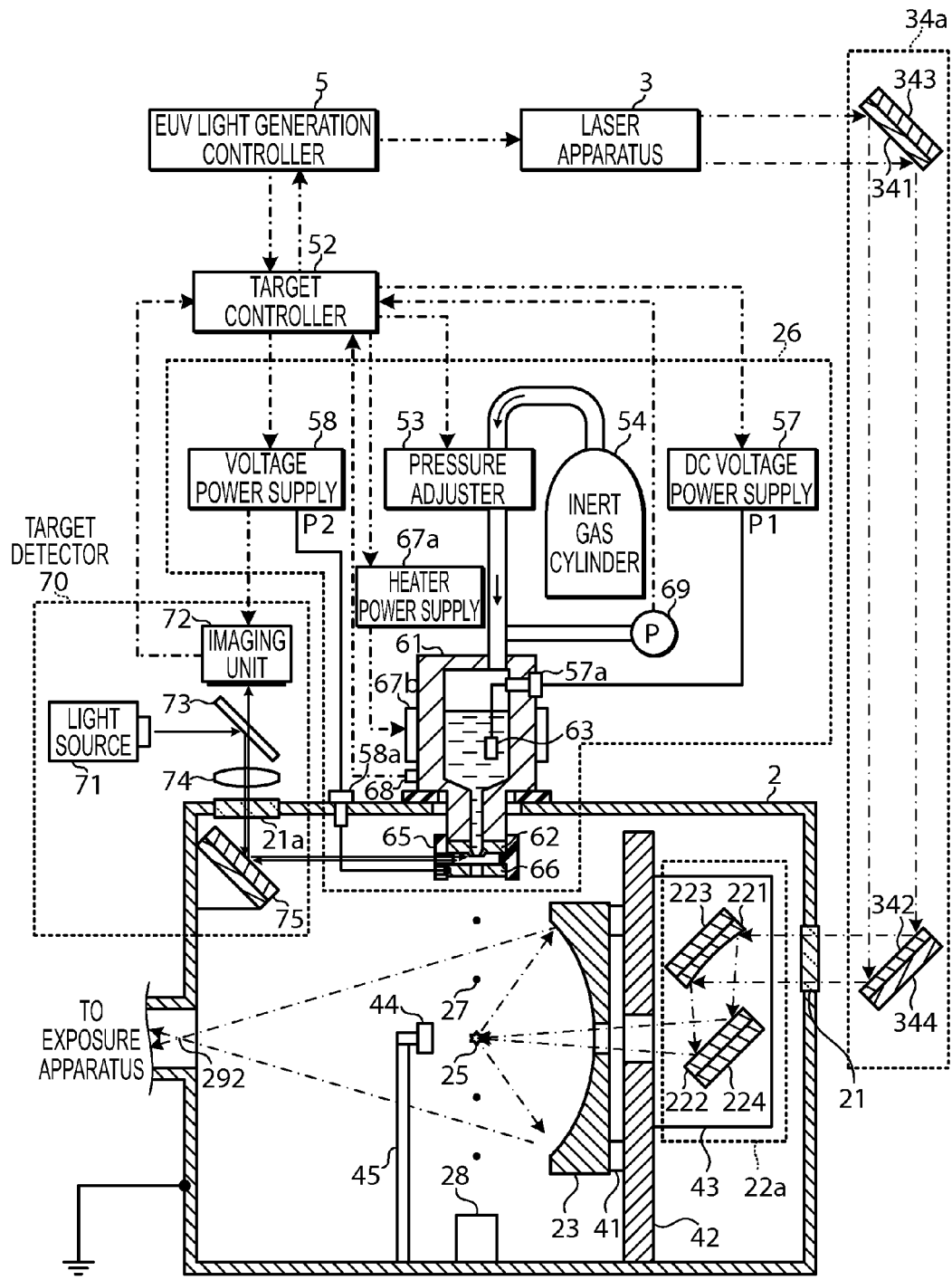
FIG. 2A is a partial sectional view illustrating an exemplary configuration of an EUV light generation system including a target generation device according to a first embodiment of the present disclosure.
Figure 2B:
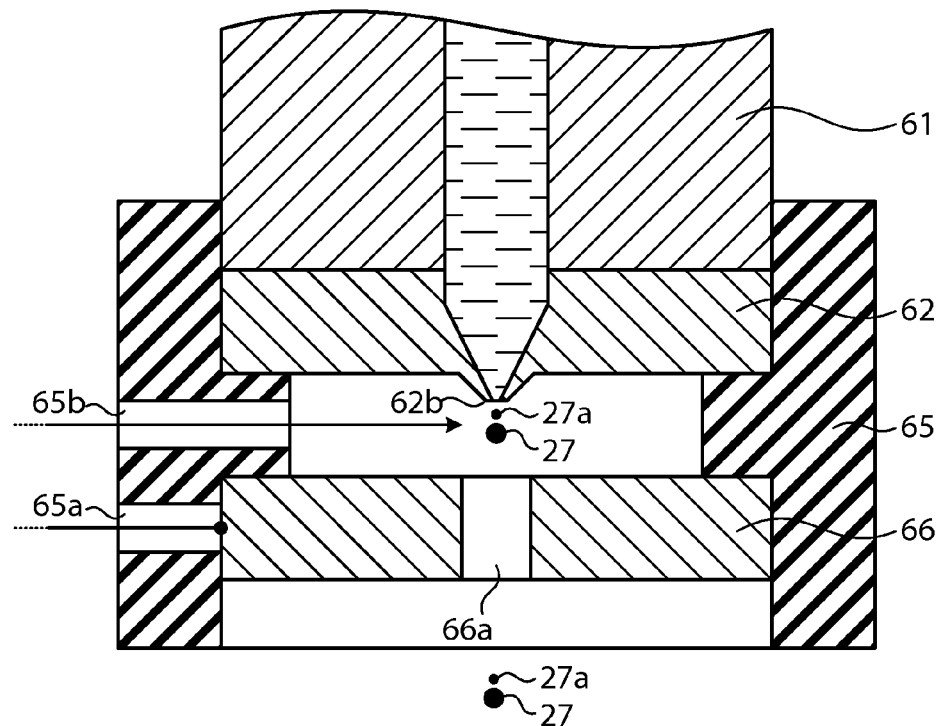
FIG. 2B is an enlarged sectional view illustrating a part of a target generator shown in FIG. 2A.

FIG. 2A is a partial sectional view illustrating an exemplary configuration of an EUV light generation system including a target generation device according to a first embodiment of the present disclosure. FIG. 2B is an enlarged sectional view illustrating a part of the target generator shown in FIG. 2A. As shown in FIG. 2A, a laser beam focusing optical system 22a, an EUV collector mirror 23, a target collector 28, an EUV collector mirror mount 41, plates 42 and 43, a beam dump 44, a beam dump support member 45 may be provided inside a chamber 2.

The chamber 2 may be formed of an electrically conductive material. The plate 42 may be attached to the chamber 2, and the plate 43 may be attached to the plate 42. The EUV collector mirror 23 may be attached to the plate 42 through the EUV collector mirror mount 41.

The laser beam focusing optical system 22a may include an off-axis paraboloidal mirror 221, a flat mirror 222, and holders 223 and 224 for the respective mirrors 221 and 222. Each of the off-axis paraboloidal mirror 221 and the flat mirror 222 may be positioned on the plate 43 through the respective mirror holders 223 and 224 such that a pulse laser beam reflected sequentially by the aforementioned mirrors is focused in a plasma generation region 25.

The beam dump 44 may be fixed to the chamber 2 through the beam dump support member 45 to be positioned in an extension of a beam path of the pulse laser beam reflected by the flat mirror 222. The target collector 28 may be provided in an extension of a trajectory of a target 27.

A target generator 26 may be mounted to the chamber 2. The target generator 26 may include a reservoir 61, a nozzle plate 62, an electrically insulating member 65, a pull-out electrode 66, a pressure adjuster 53, an inert gas cylinder 54, a DC voltage power supply 57, and a pulse voltage power supply 58.

The reservoir 61 may be configured to store a target material in a molten state. The reservoir 61 may be formed of a material that is not susceptible to reacting with the target material. For example, when tin is used as the target material, the reservoir 61 may be formed of at least one of molybdenum (Mo), tungsten (W), quartz ($SiO_2$), and silicon carbide (SiC). A heater 67b and a heater power supply 67a may be provided to melt the target material stored in the reservoir 61. The heater 67b may emit heat as electric power is supplied thereto from the heater power supply 67a. The heater 67b may be attached to a location on the reservoir 61 from which the generated heat is conducted to the target material inside the reservoir 61. That is, the heater 67b may be attached on the outer surface of the reservoir 61 or placed inside the reservoir 61. Further, a temperature sensor 68 may be attached to the reservoir 61. The heater 67b may be connected to the heater power supply, and the heater power supply may be connected to the target controller 52. The temperature sensor 68 may be connected to the target controller 51. The reservoir 61 may be electrically insulated from the wall of the chamber 2.

The nozzle plate 62 may have a through-hole formed therein, through which a liquid target material may pass. The nozzle plate 62 may have a protrusion 62b (see FIG. 2B), and thus an electric field may be enhanced at the target material in the protrusion 62b of the nozzle plate 62. The aforementioned through-hole in the nozzle plate 62 may be formed in the protrusion 62b.

The electrically insulating member 65 may be cylindrical in shape. The electrically insulating member 65 may be fixed to the reservoir 61 with the nozzle plate 62 being housed inside the electrically insulating member 65. The pull-out electrode 66 may be held in the electrically insulating member 65. The electrically insulating member 65 may provide electrical insulation between the nozzle plate 62 and the pull-out electrode 66. The pull-out electrode 66 may be provided to face the nozzle plate 62. The pull-out electrode 66 may have a through-hole 66a (see FIG. 2B) formed therein through which the targets 27 may pass.

The inert gas cylinder 54 may be connected to the pressure adjuster 53 through a first pipe. The pressure adjuster 53 may further be in communication with the interior of the reservoir 61 through a second pipe. A pressure sensor 69 may be connected to the second pipe, and the pressure sensor 69 may be connected to the target controller 52. Alternatively, the pressure sensor 69 may be embedded in the pressure adjuster 53.

An output terminal of the DC voltage power supply 57 may be electrically connected to an electrode 63 arranged inside the reservoir 61 through a feedthrough 57a provided in the reservoir 61. The electrode 63 may be in contact with the target material stored in the reservoir 61. When the reservoir 61 is formed of an electrically conductive material, the output terminal of the DC voltage power supply 57 may be connected directly to the reservoir 61, and the feedthrough 57a does not need to be provided.

An output terminal of the pulse voltage power supply 58 may be electrically connected to the pull-out electrode 66 through a feedthrough 58a provided in the chamber 2 and a through-hole 65a (see FIG. 2B) formed in the electrically insulating member 65.

The EUV light generation apparatus according to the first embodiment may include a target detector 70. The target detector 70 may include a light source 71, an imaging unit 72, a beam splitter 73, a transfer optical system 74, and a high-reflection mirror 75. The target detector 70 may be a part of a target generation device in the first embodiment.

The light source 71 may output illuminating light toward the beam splitter 73. The beam splitter 73 may be positioned to reflect a part of the illuminating light from the light source 71 toward the transfer optical system 74. The transfer optical system 74 may be positioned such that the illuminating light passing therethrough is reflected by the high-reflection mirror 75 and focused at a predetermined position along a trajectory of a target 27 through a through-hole 65b formed in the electrically insulating member 65 (see FIG. 2B).

When the target 27 is irradiated with the illuminating light, light reflected by the target 27 may travel toward the target detector 70. The transfer optical system 74 may then form an image of the target 27 on the photosensitive surface of the imaging unit 72. The beam splitter 73 provided between the transfer optical system 74 and the imaging unit 72 may transmit a part of the light reflected by the target 27. The illuminating light may be continuous-wave light. Alternatively, the imaging unit 72 may capture an image of the target 27 in synchronization with a timing at which a pulse voltage is outputted from the pulse voltage power supply 58. An operation of the pulse voltage power supply 58 will be described later.

A beam steering unit 34a, an EUV light generation controller 5, and a target controller 52 may be provided outside the chamber 2. The beam steering unit 34a may include high-reflection mirrors 341 and 342 and holders 343 and 344 for holding the respective mirrors 341 and 342. The target controller 52 may be configured to receive data respectively from the temperature sensor 68, the pressure sensor 69, and the imaging unit 72. The target controller 52 may also be configured to output control signals respectively to the pressure adjuster 53, the DC voltage power supply 57, the pulse voltage power supply 58, and the heater power supply 67a.

3.2 Operation 3.2.1 Output of Target and Pulse Laser Beam

The pressure adjuster 53 may be configured to adjust a pressure of the inert gas supplied from the inert gas cylinder 54 and pressurize the molten target material in the reservoir 61 in accordance with a control signal from the target controller 52. As the pressure adjuster 53 pressurizes the target material in the reservoir 61, the target material may protrude slightly from the protrusion 62b through the through-hole formed therein.

The DC voltage power supply 57 may apply a constant potential to the target material through the electrode 63 provided in the reservoir 61 in accordance with a control signal from the target controller 52. The pulse voltage power supply 58 may also apply a pulsed potential to the pull-out electrode 66 in accordance with the control signal from the target controller 52. Thus, a pulsed voltage may be applied between the target material and the pull-out electrode 66, and an electric field may be generated therebetween. As a result, the Coulomb force may be generated between the target material and the pull-out electrode 66.

In particular, the electric field may be enhanced at the target material protruding from the protrusion 62b when the target material is pressurized by the inert gas. Thus, the Coulomb force may be enhanced between the target material protruding from the protrusion 62b and the pull-out electrode 66. This Coulomb force may cause a target 27 to be outputted from the protrusion 62b in the form of a charged droplet.

Figure 3A:
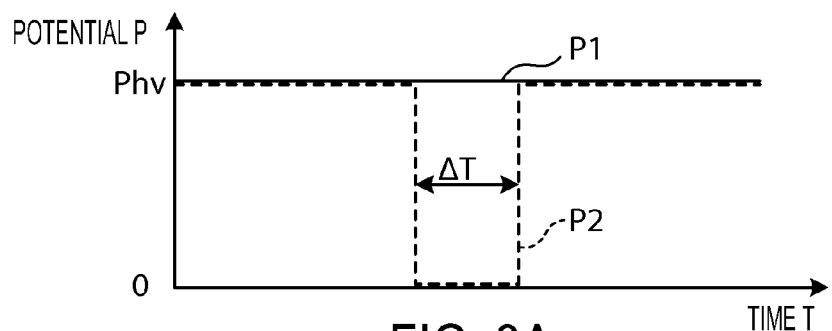
FIG. 3A shows an example of potentials to be applied to a target material and to a pull-out electrode.

FIG. 3A shows an example of potentials to be applied to a target material and to a pull-out electrode. The DC voltage power supply 57 may maintain a potential P1 of the target material in the reservoir 61 at a predetermined potential Phv of, for example, 20 kV. The pulse voltage power supply 58 may first have a potential P2 of the pull-out electrode 66 at the predetermined potential Phv, and change the potential P2 to a potential of, for example, 0 V, which is equal to the potential of the chamber 2, when a target 27 is to be outputted. The pulse voltage power supply 58 may change the potential P2 back to the predetermined potential Phv after a predetermined time ΔT, which corresponds to a pulse duration, elapses.

Figure 3B:
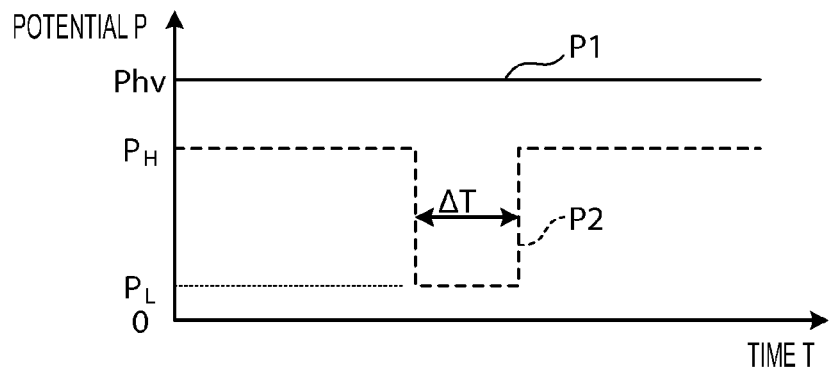
FIG. 3B shows another example of potentials to be applied to a target material and to a pull-out electrode.

FIG. 3B shows another example of potentials to be applied to a target material and a pull-out electrode. The DC voltage power supply 57 may maintain a potential P1 of the target material in the reservoir 61 at a predetermined potential Phv of, for example, 20 kV. The pulse voltage power supply 58 may first have a potential P2 of the pull-out electrode 66 at a potential $P_H$ of, for example, 15 kV, and change the potential P2 to a potential $P_L$ of, for example, 5 kV when a target 27 is to be outputted. The pulse voltage power supply 58 may change the potential P2 back to the potential $P_H$ after a predetermined time ΔT, which corresponds to a pulse duration, elapses. Here, the potential $P_H$ and the potential $P_L$ may be in a range of $Phv \geq P_H > P_L \geq P_C$, where $P_C$ may be a potential of the chamber 2 may be a ground potential of 0 V.

The target controller 52 may be configured to control the pressure adjuster 53 and the pulse voltage power supply 58 so that a target 27 is outputted at a timing given by the EUV light generation controller 5. A target 27 outputted into the chamber 2 may be supplied to the plasma generation region 25 inside the chamber 2.

A pulse laser beam outputted from the laser apparatus 3 (see FIG. 2A) may be reflected sequentially by the high-reflection mirrors 341 and 342, and may enter the laser beam focusing optical system 22a through the window 21. The pulse laser beam that has entered the laser beam focusing optical system 22a may be reflected sequentially by the off-axis paraboloidal mirror 221 and the flat mirror 222. The EUV light generation controller 5 may control the laser apparatus 3 so that a target 27 outputted from the target generator 26 is irradiated with the pulse laser beam in the plasma generation region 25.

3.2.2 Detection and Suppression of Satellite

Figure 4A:
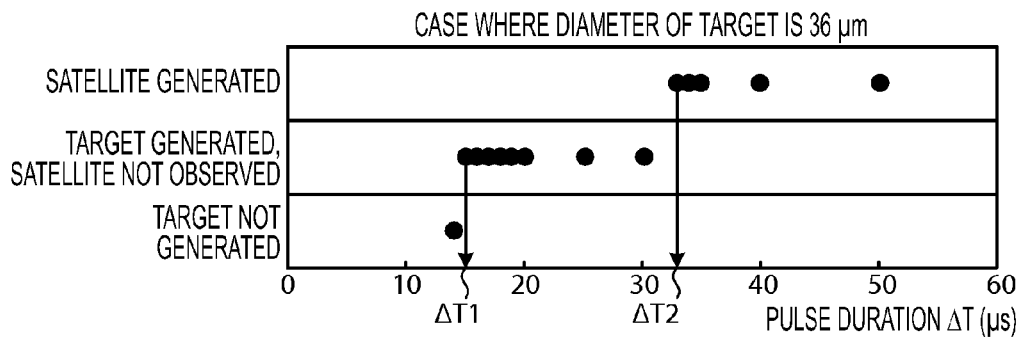
FIG. 4A shows an example of a relationship between a pulse duration of a voltage applied to a target generator and a target generation result.
Figure 4B:
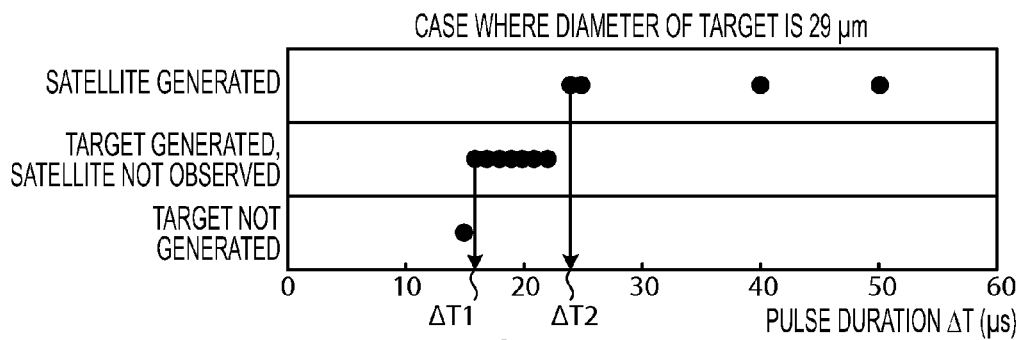
FIG. 4B shows another example of a relationship between a pulse duration of a voltage applied to a target generator and a target generation result.
Figure 4C:
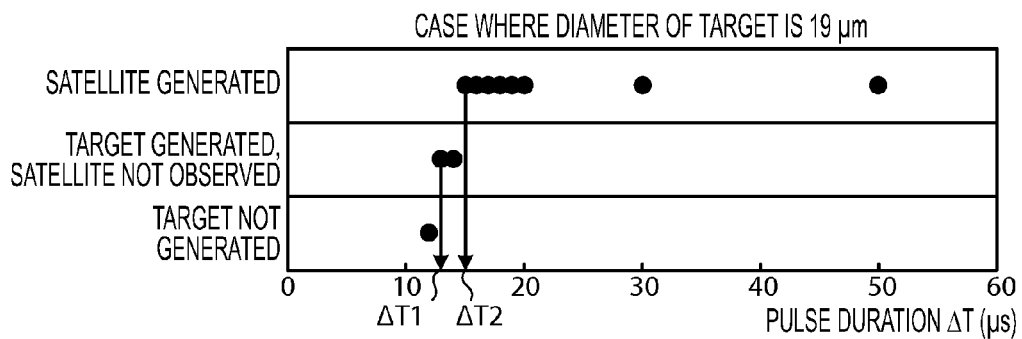
FIG. 4C shows yet another example of a relationship between a pulse duration of a voltage applied to a target generator and a target generation result.

FIGS. 4A through 4C show examples of a relationship between a pulse duration of a voltage applied in a target generator and a target generation result. The results shown in FIGS. 4A through 4C were obtained using the same target generator 26. FIG. 4D is a table showing driving conditions of the target generator to obtain the results shown in FIGS. 4A through 4C. "Condition A" in FIG. 4D is a condition for generating a target 27 having a target diameter D of 36 μm, and the relationship between the pulse duration ΔT and the target generation results is shown in FIG. 4A. "Condition B" in FIG. 4D is a condition for generating a target 27 having a target diameter D of 29 μm, and the relationship between the pulse duration ΔT and the target generation results is shown in FIG. 4B. "Condition C" in FIG. 4D is a condition for generating a target 27 having a target diameter D of 19 μm, and the relationship between the pulse duration ΔT and the target generation results is shown in FIG. 4C.

When a target 27 is to be generated by a single pulse of a pulse voltage applied from the pulse voltage power supply 58 in the target generator 26, a satellite 27a (see FIG. 2B) may also be generated. The presence/absence of a satellite 27a and/or the size thereof may differ depending on a variety of conditions for driving the target generator 26.

As shown in FIG. 4A, when the target generator 26 was operated under a condition where a target diameter D of a target 27 to be generated is 36 μm, a target 27 was not generated when a pulse duration ΔT was shorter than 15 μs. On the other hand, when the pulse duration ΔT was equal to or longer than 32 μs, a satellite 27a, in addition to a target 27, was generated. When the pulse duration ΔT was in a range of 15 μs≤ΔT<32 μs, a target 27 was generated but a satellite 27a was not observed.

As shown in FIG. 4B, when the target generator 26 is operated under a condition where a target diameter D of a target 27 is 29 μm, a target 27 was generated but a satellite 27a was not observed when the pulse duration ΔT was in a range of 16 μs≤ΔT<23 μs.

As shown in FIG. 4C, when the target generator 26 is operated under a condition where a target diameter D of a target 27 is 19 μm, a target 27 was generated but a satellite 27a was not observed when the pulse duration ΔT was in a range of 13 μs≤ΔT<15 μs.

Figure 4E:
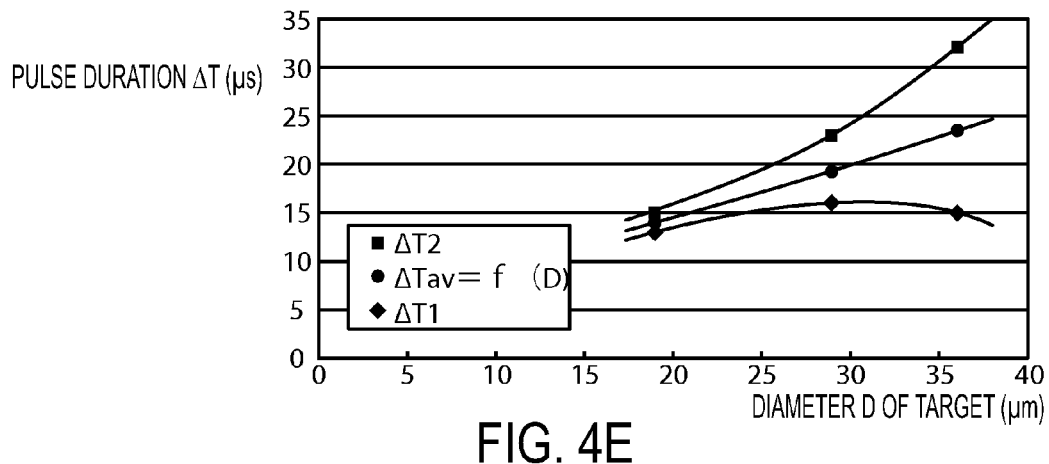
FIG. 4E is a graph summarizing the results shown in FIGS. 4A through 4C.

FIG. 4E is a graph summarizing the results of the experiment shown in FIGS. 4A through 4C. In FIG. 4D, ΔT1 is the minimum value of the pulse duration ΔT when a target 27 was generated, and ΔT2 is the minimum value of the pulse duration ΔT when a satellite 27a was observed.

In order to suppress a satellite 27a when a target 27 is generated, a pulse duration ΔT may be adjusted to fall within a range of ΔT1≤ΔT<ΔT2. For example, a pulse duration ΔT may be adjusted to a value obtained through the following expression.

$$\Delta T = \Delta Tav = (\Delta T1 + \Delta T2)/2$$

That is, a pulse duration ΔT may be adjusted to an average value ΔTav of the upper and lower limits of the range of a pulse duration ΔT in which a target 27 is generated but a satellite 27a is not observed. The average value ΔTav may depend on a target diameter D of a target 27 to be generated when the same target generator 26 is used (ΔTav=f(D)).

Alternatively, depending on experimental results, ΔT1 may be the maximum value of a pulse duration ΔT when a target 27 is not generated, and ΔT2 may be the maximum value of a pulse duration ΔT when a satellite 27a is not observed. In this case, in order to suppress a satellite 27a when a target 27 is generated, a pulse duration ΔT may be adjusted to fall within a range of ΔT1<ΔT≤ΔT2.

The imaging unit 72 may be configured to capture an image of a predetermined region along a trajectory of a target 27 and output captured image data to the target controller 52. The target controller 52 may determine whether or not a target 27 is generated based on the image data from the imaging unit 72. Further, the target controller 52 may determine whether or not a satellite 27a is generated based on the image data from the imaging unit 72. When a satellite 27a is observed, the satellite 27a may be determined to be generated. When a satellite 27a is not observed, the satellite 27a may be determined not to be generated.

Further, the target controller 52 may be configured to determine the minimum value ΔT1 of the pulse duration ΔT when the target 27 is generated. In addition, the target controller 52 may be configured to determine the minimum value ΔT2 of the pulse duration ΔT when the satellite 27a is observed. Then, the target controller 52 may set a value between ΔT1 and ΔT2, such as an average value ΔTav, in the pulse duration ΔT, and control the pulse voltage power supply 58 accordingly.

3.2.3 Main Flow

Figure 5:
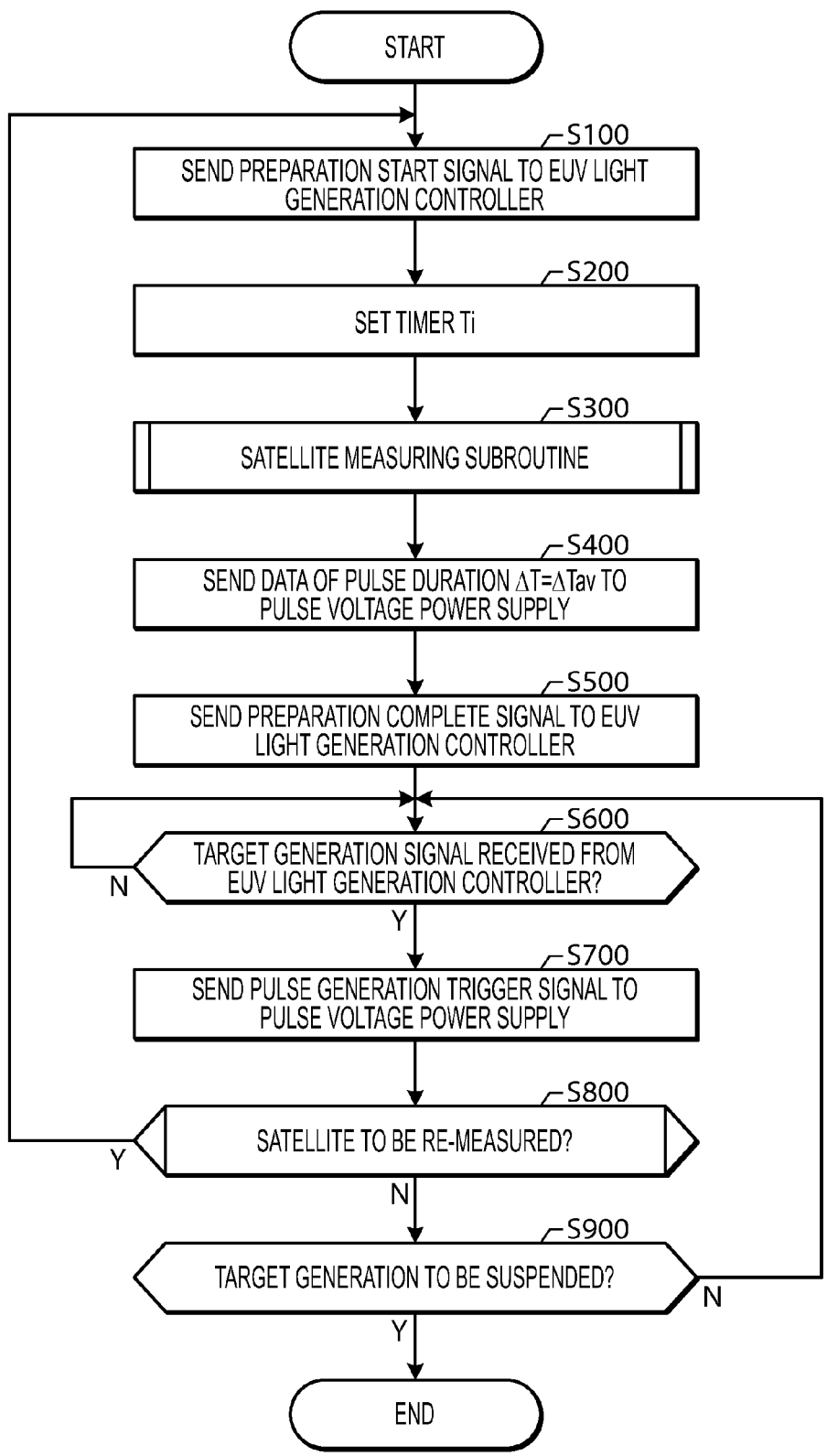
FIG. 5 is a flowchart showing an exemplary operation of a target controller of the first embodiment.

FIG. 5 is a flowchart showing an exemplary operation of a target controller of the first embodiment. The target controller 52 may calculate such a pulse duration that a satellite 27a may be suppressed through the following operation and control the pulse voltage power supply 58 based on a calculation result.

The target controller 52 may first send a preparation start signal to the EUV light generation controller 5 (Step S100). Upon receiving a preparation start signal, the EUV light generation controller 5 may recognize that a satellite is being measured. Then, the target controller 52 may set a timer Ti to determine a cycle of measuring a satellite and start the count in the timer Ti from 0 (Step S200).

Subsequently, the target controller 52 may measure a satellite and calculate ΔTav as a pulse duration ΔT with which a satellite 27a may be suppressed (Step S300). Details of Step S300 will be described later. Then, the target controller 52 may send data on ΔTav serving as a pulse duration ΔT to the pulse voltage power supply 58 (Step S400).

Then, the target controller 52 may send a preparation complete signal to the EUV light generation controller 5 (Step S500). Upon receiving a preparation complete signal, the EUV light generation controller 5 may recognize that measurement of a satellite is completed.

Subsequently, the target controller 52 may determine whether or not it has received a target generation signal from the EUV light generation controller 5 (Step S600). When a target generation signal is not received, the target controller 52 may stand by until it receives a target generation signal. When a target generation signal has been received, the target controller 52 may proceed to Step S700.

In Step S700, the target controller 52 may send a pulse generation trigger signal to the pulse voltage power supply 58. Then, the pulse voltage power supply 58 may generate a pulse voltage in accordance with the data on the pulse duration ΔT received in Step S400, and cause a target 27 to be outputted through the nozzle plate 62.

Thereafter, the target controller 52 may determine whether or not a satellite is to be measured again (Step S800). Details of Step S800 will be described later. When a satellite is to be measured again (Step S800; YES), the target controller 52 may return to Step S100, and send a preparation start signal to the EUV light generation controller 5. When a satellite is not to be measured again (Step S800; NO), the target controller 52 may proceed to Step S900.

In Step S900, the target controller 52 may determine whether or not the generation of a target is to be suspended. This determination may be made based on a control signal from the EUV light generation controller 5. When the generation of a target is not to be suspended (Step S900; NO), the target controller 52 may return to Step S600, and wait for a target generation signal from the EUV light generation controller 5. When the generation of a target is to be suspended (S900; YES), the operation in this flowchart may be terminated.

3.2.4 Measurement of Satellite (Details of Step S300)

Figure 6A:
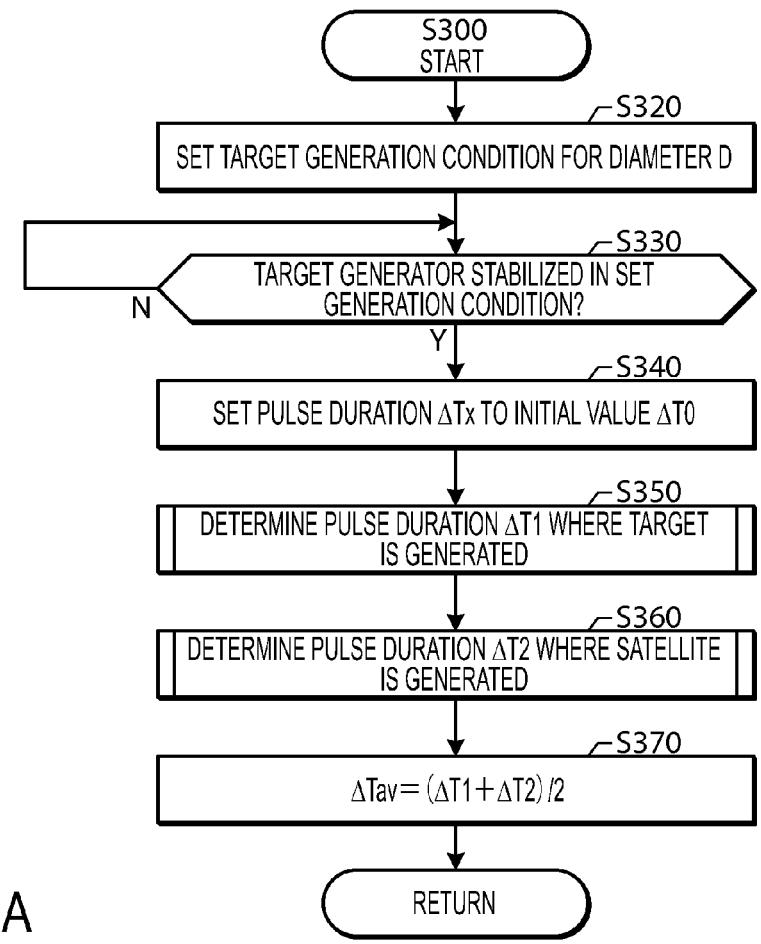
FIG. 6A is a flowchart showing a satellite measuring subroutine shown in FIG. 5.

FIG. 6A is a flowchart showing a satellite measuring subroutine shown in FIG. 5. A process shown in FIG. 6A may be carried out by the target controller 52.

The target controller 52 may first set a target generation condition for the case where a target diameter of a target is D (Step S320). As a target generation condition, for example, a pressure and a temperature of the target material in the reservoir 61 may be set, and the pressure adjuster 53, and the heater power supply 67a may be controlled accordingly. FIG. 4D may be referred to for specific conditions.

Subsequently, the target controller 52 may determine whether or not the target generator 26 is stabilized in the set target generation condition (Step S330). For example, the target controller 52 may determine whether or not output variation ranges of the pressure sensor 69 and the temperature sensor 68 stay within a predetermined range for a given period based on outputs of the pressure sensor 69 and the temperature sensor 68. When the target generator 26 is not stabilized, the target controller 52 may stand by until the target generator 26 is stabilized. When the target generator 26 is stabilized, the target controller 52 may proceed to Step S340.

In Step S340, the target controller 52 may set a pulse duration ΔTx for measuring a satellite to an initial value ΔT0 (ΔTx=ΔT0). The initial value ΔT0 may, for example, be a pulse duration with which a target is not generated. Here, the initial value ΔT0 may be determined in advance through an experiment. Then, the target controller 52 may determine the minimum value ΔT1 of a pulse duration ΔT with which a target is generated (Step S350). Details of Step S350 will be described later. Subsequently, the target controller 52 may determine the minimum value ΔT2 of a pulse duration ΔT with which a satellite is observed (Step S360). Details of Step S360 will be described later.

Thereafter, in Step S370, the target controller 52 may calculate an average value ΔTav of ΔT1 and ΔT2 (ΔTav=(ΔT1+ΔT2)/2), and proceed to Step S400.

Figure 6B:
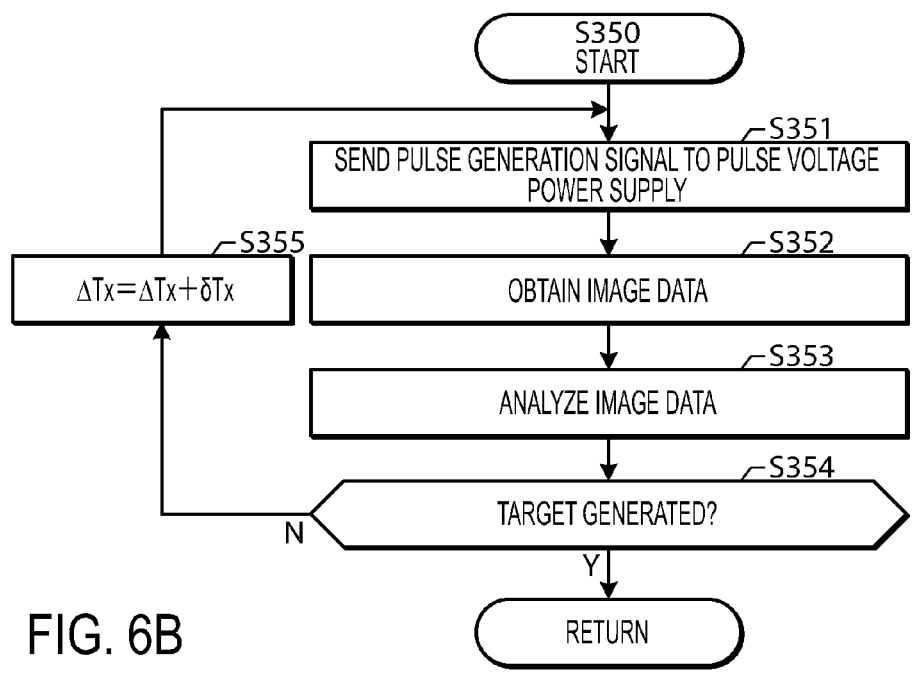
FIG. 6B is a flowchart showing a subroutine shown in FIG. 6A for determining a pulse duration All.

FIG. 6B is a flowchart showing a subroutine shown in FIG. 6A for determining a pulse duration ΔT1. The subroutine shown in FIG. 6B may be carried out by the target controller 52.

The target controller 52 may first send a pulse generation signal to the pulse voltage power supply 58 (Step S351). A pulse generation signal may include data on the pulse duration ΔTx set in Step S340 and a pulse generation trigger signal.

Then, the target controller 52 may obtain image data from the imaging unit 72 (Step S352). Subsequently, the target controller 52 may analyze the obtained image data (Step S353).

The target controller 52 may then determine whether or not a target 27 is generated based on the analysis of the image data (Step S354).

When a target 27 is not generated (Step S354; NO), a value obtained by adding a predetermined value δTx to the current pulse duration ΔTx (ΔTx+δTx) may be set as a new pulse duration ΔTx (Step S355), and the target controller 52 may return to Step S351.

When a target 27 is generated (Step S354; YES), the target controller 52 may calculate a diameter D of the target 27. The target controller 52 may also store the pulse duration ΔTx at this instance as a provisional value of ΔT1. Then, the target controller 52 may terminate the process in this flowchart and proceed to Step S360.

Figure 6C:
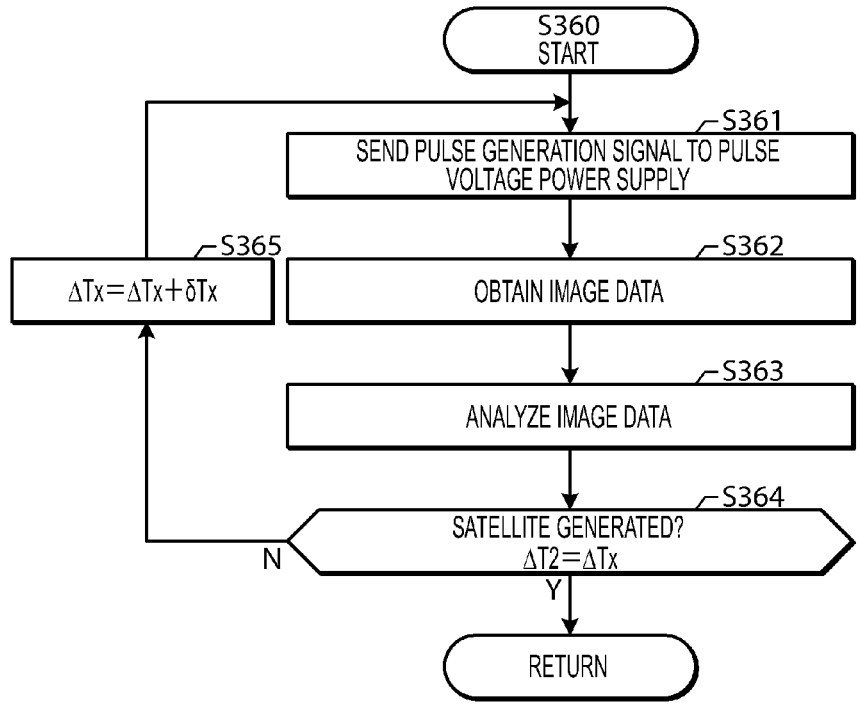
FIG. 6C is a flowchart showing a subroutine shown in FIG. 6A for determining a pulse duration $\Delta T2$.

FIG. 6C is a flowchart showing a subroutine shown in FIG. 6A for determining a pulse duration ΔT2. The operation shown in FIG. 6C may be carried out by the target controller 52.

The target controller 52 may first send a pulse generation signal to the pulse voltage power supply 58 (Step S361). A pulse generation signal may include data on the pulse duration ΔTx set in Step S355 and a pulse generation trigger signal.

Then, the target controller 52 may obtain image data from the imaging unit 72 (Step S362). Subsequently, the target controller 52 may analyze the obtained image data (Step S363).

The target controller 52 may then determine whether or not a satellite 27a is generated based on the analysis of the image data (Step S364).

When a satellite 27a is not observed (Step S364; NO), a value obtained by adding a predetermined value δTx to the current pulse duration ΔTx (ΔTx+δTx) may be set as a new pulse duration ΔTx (Step S365), and the target controller 52 may return to Step S361. Here, δTx may be the same value as δTx described with reference to FIG. 6B, or may be a different value δTy.

When a satellite 27a is observed (Step S364; YES), the target controller 52 may calculate a diameter D of a target 27. The target controller 52 may also store the pulse duration ΔTx at this instance as a provisional value of δT2. Then, the target controller 52 may proceed to Step S370.

3.2.5 Determining Whether or not to Re-Measure Satellite (Details of Step S800)

Figure 7:
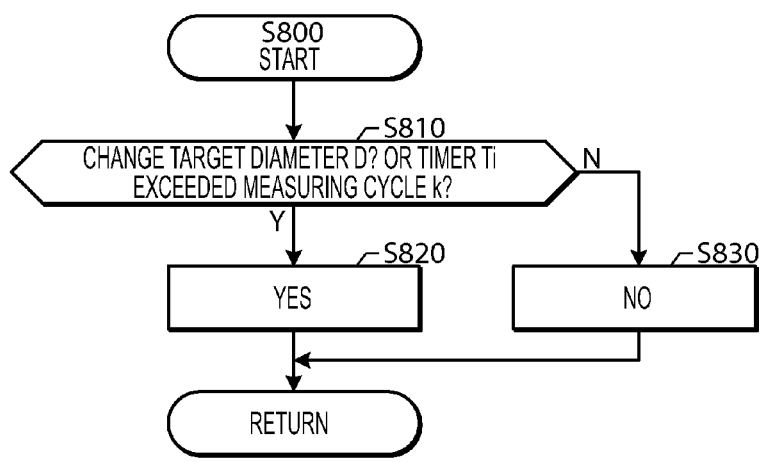
FIG. 7 is a flowchart showing a subroutine shown in FIG. 5 for determining whether or not to re-measure a satellite.

FIG. 7 is a flowchart showing a subroutine for determining whether or not to re-measure a satellite shown in FIG. 5. The operation shown in FIG. 7 may be carried out by the target controller 52.

The target controller 52 may first determine whether or not a diameter D of a target 27 is to be changed or whether or not a count in the timer Ti has exceeded a cycle k for measuring a satellite (Step S810). The determination on whether or not a diameter D of a target 27 is to be changed may be made based on a control signal from the EUV light generation controller 5. The timer Ti may be the timer set in Step S200 described above.

When a diameter D of a target 27 is to be changed or when the count in the timer Ti has exceeded the cycle k (Step S810; YES), the determination result of Step S800 may be set to YES (Step S820), and the target controller 52 may then return to Step S100.

When a diameter D of a target 27 is not to be changed and the count in the timer Ti has not exceeded the cycle k (Step S810; NO), the determination result of S800 may be set to NO (Step S830), and the target controller 52 may proceed to Step S900.

In the first embodiment, the target detector 70 included in the EUV light generation apparatus may capture an image of a predetermined region along a trajectory of a target 27, and the target controller 52 may determine the presence/absence of a target 27 and the presence/absence of a satellite 27a or an amount of a satellite 27a, if any, observed. Based on this determination result, the target controller 52 may set a pulse duration ΔT with which a satellite 27a may be suppressed, and the pulse voltage power supply 58 may be controlled accordingly. Further, when the condition of the target generator 26 changes while the EUV light generation apparatus is in use, a pulse duration ΔT may be reset to suppress a satellite 27a. As a result, components in the chamber 2 may be prevented from being contaminated.

4. Target Generation Device

Second Embodiment 4.1 Configuration

Figure 8:
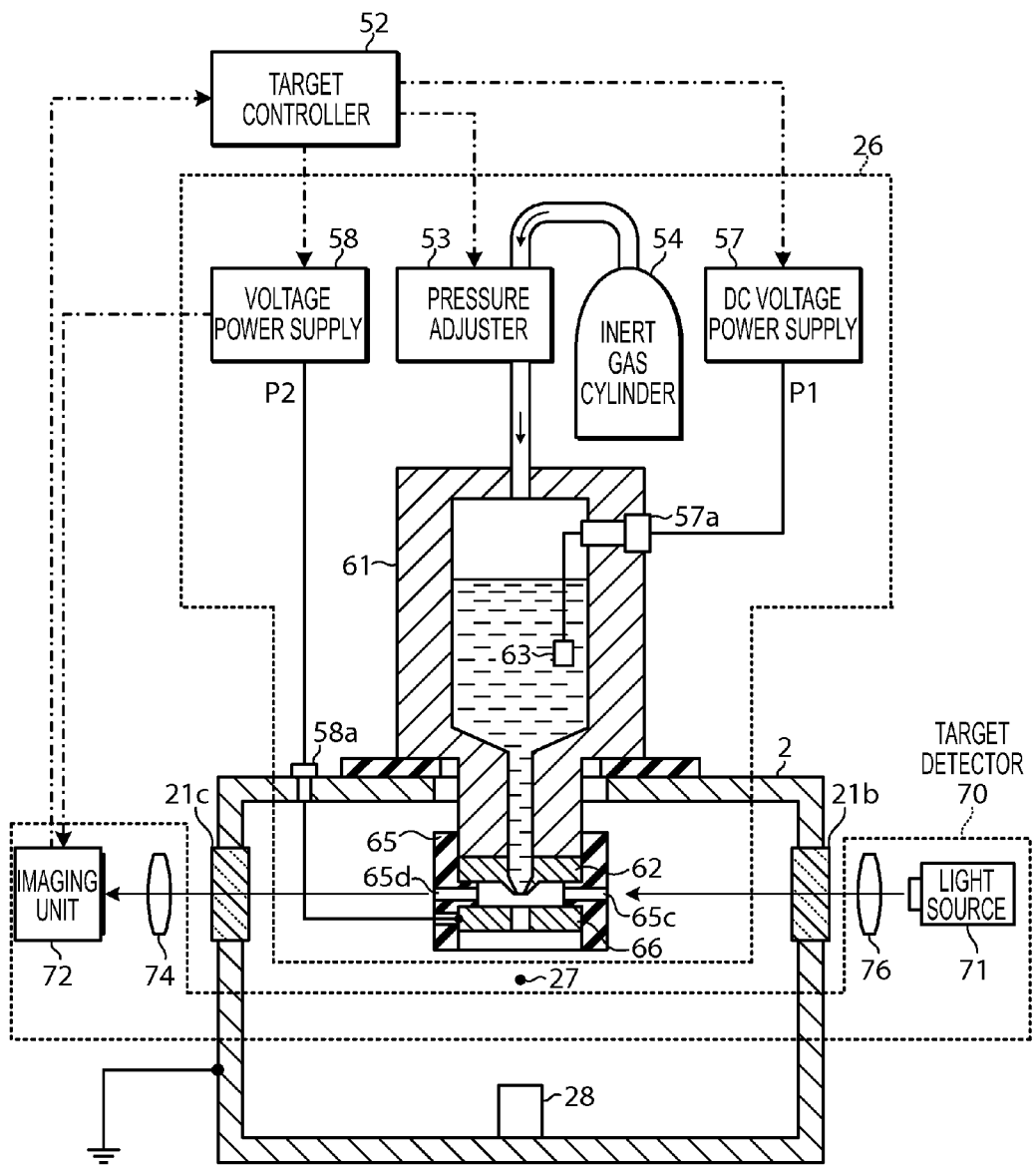
FIG. 8 is a partial sectional view illustrating an exemplary configuration of a target generation device according to a second embodiment of the present disclosure.

FIG. 8 is a partial sectional view illustrating an exemplary configuration of a target generation device according to a second embodiment of the present disclosure. The target generation device according to the second embodiment may be configured to calculate a pulse duration ΔT with which generation of a satellite can be suppressed. The target detector 70 shown in FIG. 2A and a target detector 70 shown in FIG. 8 may be replaceable with each other.

A pulse duration ΔT with which a satellite 27a is suppressed may depend not only on conditions, such as a diameter D of a target 27, for operating the target generator 26 but also on individual differences among different target generators 26. Thus, a pulse duration ΔT with which a satellite 27a is suppressed may be measured for each target generator 26. For example, a pulse duration ΔT with which a satellite 27a is suppressed may be measured prior to installing a target generator 26 to the EUV light generation apparatus. Alternatively, a pulse duration ΔT with which a satellite 27a is suppressed may be measured when a target generator 26 is removed from the EUV light generation apparatus for maintenance work.

With reference to FIG. 8, the target generation device of the second embodiment may include a chamber 2a, the target controller 52, and the target detector 70. The target generator 26 may be removably mounted to the chamber 2a.

The target detector 70 may include the light source 71, the imaging unit 72, the transfer optical system 74, and a focusing optical system 76. The focusing optical system 76 may be positioned to focus illuminating light from the light source 71 at a position along a trajectory of a target 27 through a window 21b of the chamber 2a and a through-hole 65c formed in the electrically insulating member 65.

When a target 27 is in a path of the illuminating light and is irradiated with the illuminating light, the illuminating light may be absorbed or scattered by the target 27, and a part of the illuminating light may reach the transfer optical system 74 through a through-hole 65d formed in the electrically insulating member 65 and a window 21c. The transfer optical system 74 may be positioned to form an image of the target 27 on the photosensitive surface of the imaging unit 72. When the target 27 is not in a path of the illuminating light, the imaging unit 72 may capture an image of the illuminating light that passes through a region including a designed trajectory of a target 27.

4.2 Operation

Figure 9:
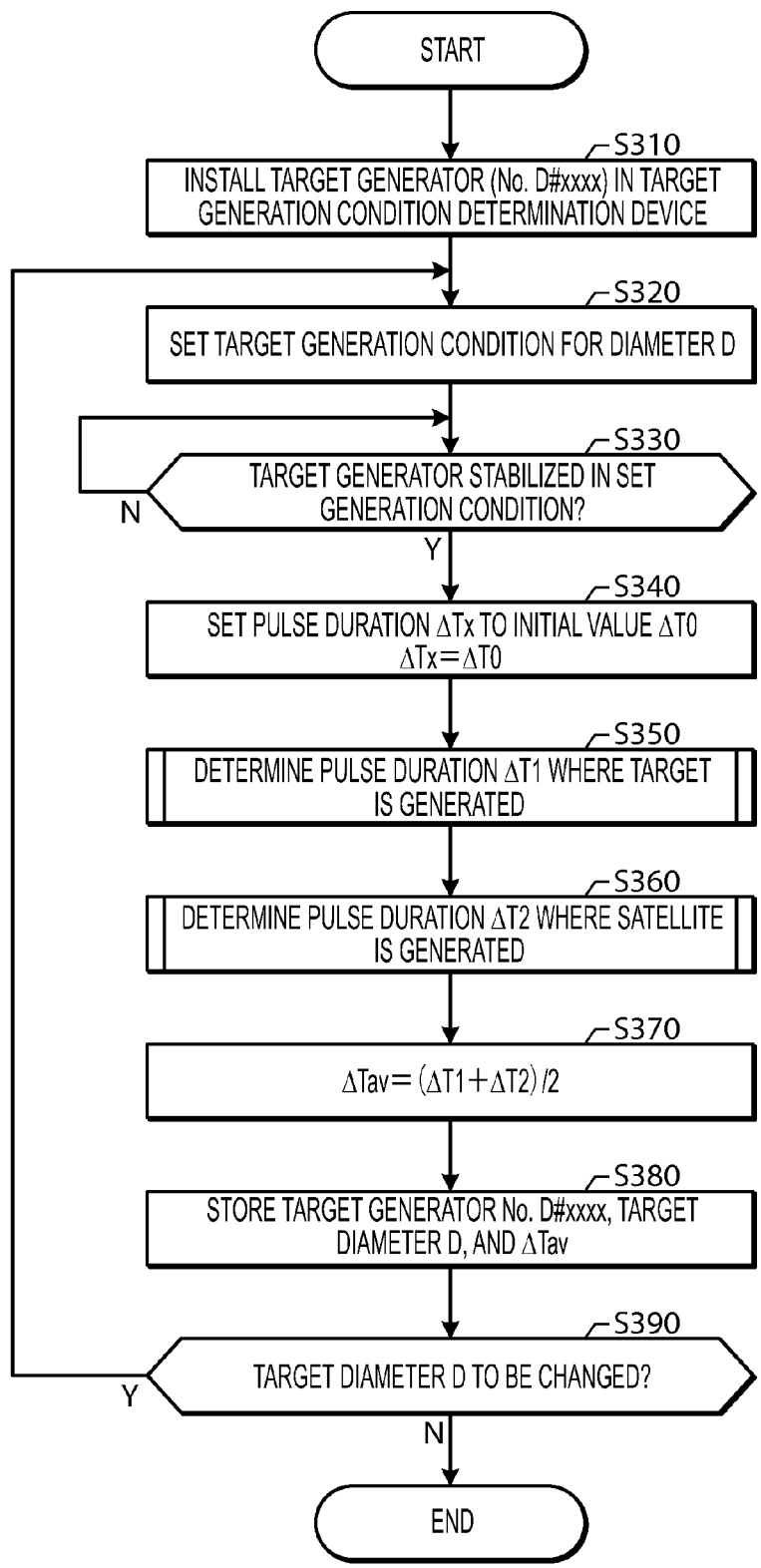
FIG. 9 is a flowchart showing an exemplary operation in the second embodiment.

FIG. 9 is a flowchart showing an exemplary operation in the second embodiment. The target generation device may calculate a pulse duration ΔT with which a satellite 27a is suppressed through the following operation.

First, a target generator 26 may be installed onto the target generation device (Step S310). The target generator 26 may be assigned with a device number, for example, of D#xxxx as ID information of the target generator 26.

Then, the target controller 52 may set a target generation condition for the case where a target diameter of a target 27 is set to D (Step S320). As a target generation condition, for example, a pressure and a temperature of the target material in the reservoir 61 may be set, and the pressure adjuster 53, and the heater power supply 67a may be controlled accordingly. FIG. 4D may be referred to for specific conditions.

Then, the target controller 52 may determine whether or not the target generator 26 is stabilized in the set target generation condition (Step S330). For example, the target controller 52 may determine whether or not output variation ranges of the pressure sensor 69 (see FIG. 2A) and the temperature sensor 68 (see FIG. 2A) fall within respective predetermined ranges for a given period based on outputs of the pressure sensor 69 and the temperature sensor 68. When the target generator 26 is not stabilized, the target controller 52 may stand by until the target generator 26 is stabilized. When the target generator 26 is stabilized, the target controller 52 may proceed to Step S340.

In Step S340, the target controller 52 may set a pulse duration $\Delta Tx$ for measuring a satellite 27a to an initial value $\Delta T0 (\Delta Tx = \Delta T0)$. Then, the target controller 52 may determine the minimum value $\Delta T1$ of a pulse duration $\Delta T$ with which a target 27 is generated (Step S350). This process may be similar to that described with reference to FIG. 6B. Subsequently, the target controller 52 may determine the minimum value $\Delta T2$ of a pulse duration $\Delta T$ with which a satellite 27a is observed (Step S360). This process may be similar to that described with reference to FIG. 6C.

Then, in Step S370, the target controller 52 may calculate an average value $\Delta Tav$ of $\delta T1$ and $\Delta T2$ ($\Delta Tav=(\Delta T1+\Delta T2)/2$). Subsequently, the target controller 52 may store the device number (e.g., D#xxxx) of the target generator 26, the diameter D of the target 27, and the average value $\Delta Tav$ in association with one another, in a memory (Step S380).

Thereafter, the target generator 26 may determine whether or not to change a diameter D of a target 27 (Step S390). For example, when a satellite 27a is to be measured for a first diameter D1 and a second diameter D2 of a target 27, after the measurement of the satellite 27a for the first diameter D1 is completed, the diameter D of the target 27 may be changed to the second diameter D2 (Step S390; YES). In this case, the target generator 26 may return to Step S320 described above and newly set a target generation condition. When the measurement of the satellite 27a is completed for the first diameter D1 and the second diameter D2, the process in this flowchart may be terminated without changing the diameter D of the target 27 (Step S390; NO). Further, when the satellite 27a is measured for three or more diameters, D1, D2, and D3, the average value $\Delta Tav$ may be obtained for each diameter, and an approximation function ($\Delta Tav=f(D)$) may be induced for calculating an average value $\Delta Tav$ using the diameter D of the target 27. The graph shown in FIG. 4E may be obtained through the above-described process.

Other points may be similar to those of the first embodiment. Even when the target detector 70 is not provided in the EUV light generation apparatus, an average value $\Delta Tav$ serving as a pulse duration $\Delta T$ with which a satellite 27a is suppressed may be calculated through an approximation function ($\Delta Tav=f(D)$) or obtained from the graph shown in FIG. 4E. A target generator 26 for which an average value $\Delta Tav$ has been calculated may be installed in the EUV light generation apparatus, and the data on the average value $\Delta Tav$ may be inputted the EUV light generation apparatus. Then, a satellite 27a may be suppressed, and components in the chamber 2a may be prevented from being contaminated.

5. EUV Light Generation Apparatus

Third Embodiment

5.1 Configuration

Figure 10:
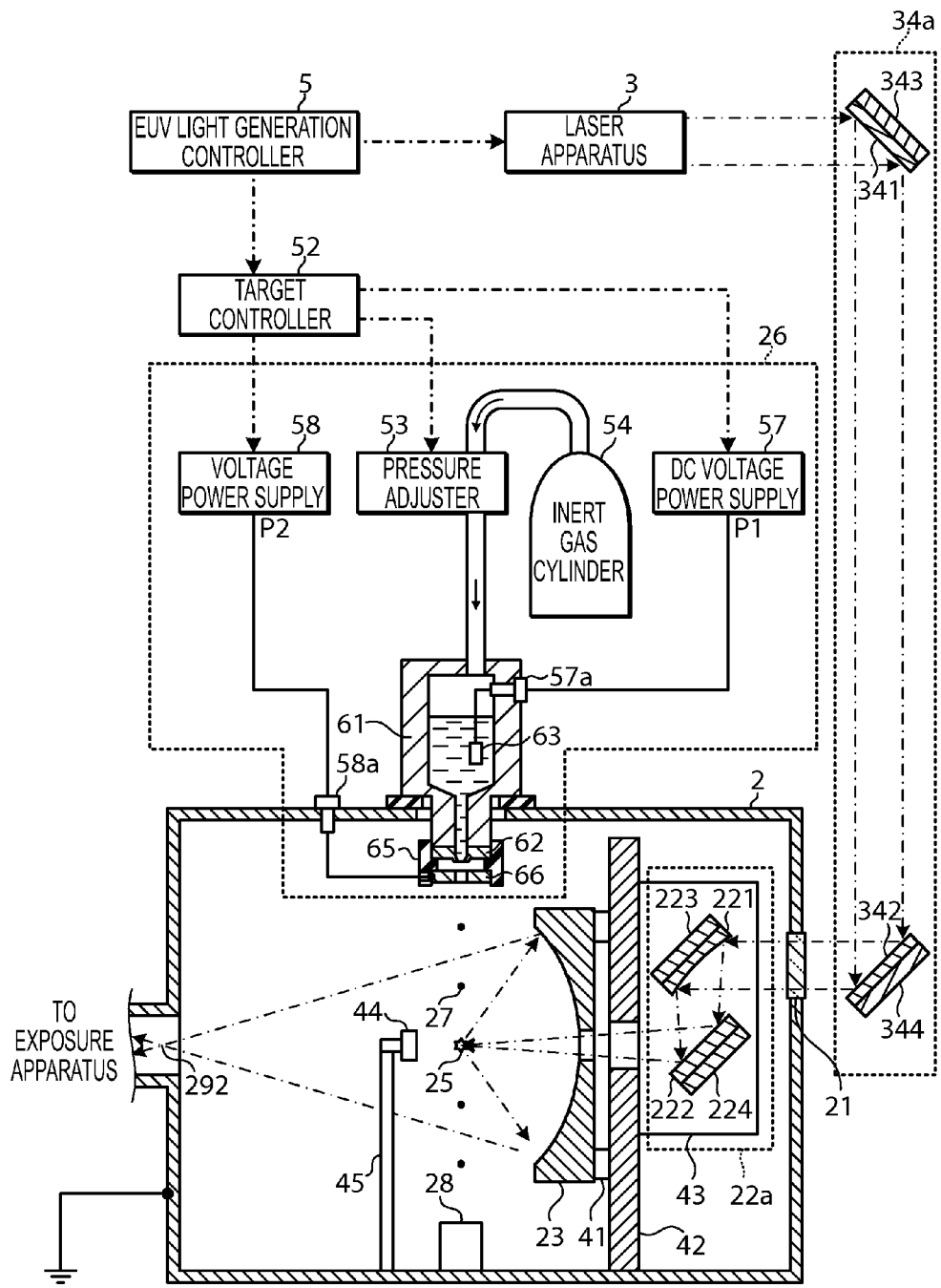
FIG. 10 is a partial sectional view illustrating an exemplary configuration of an EUV light generation system according to a third embodiment of the present disclosure.

FIG. 10 is a partial sectional view illustrating an exemplary configuration of an EUV light generation apparatus according to a third embodiment of the present disclosure. The EUV light generation apparatus according to the third embodiment may not include the target detector 70.

According to the second embodiment, a pulse duration $\Delta T$ with which a satellite 27a is suppressed may be determined for the device number of a given target generator 26. Thus, in the third embodiment, the pulse voltage power supply 58 may be controlled using data determined in advance as the pulse duration $\Delta T$ with which a satellite 27a is suppressed for a given target generator 26.

5.2 Operation 5.2.1 Main Flow

Figure 11:
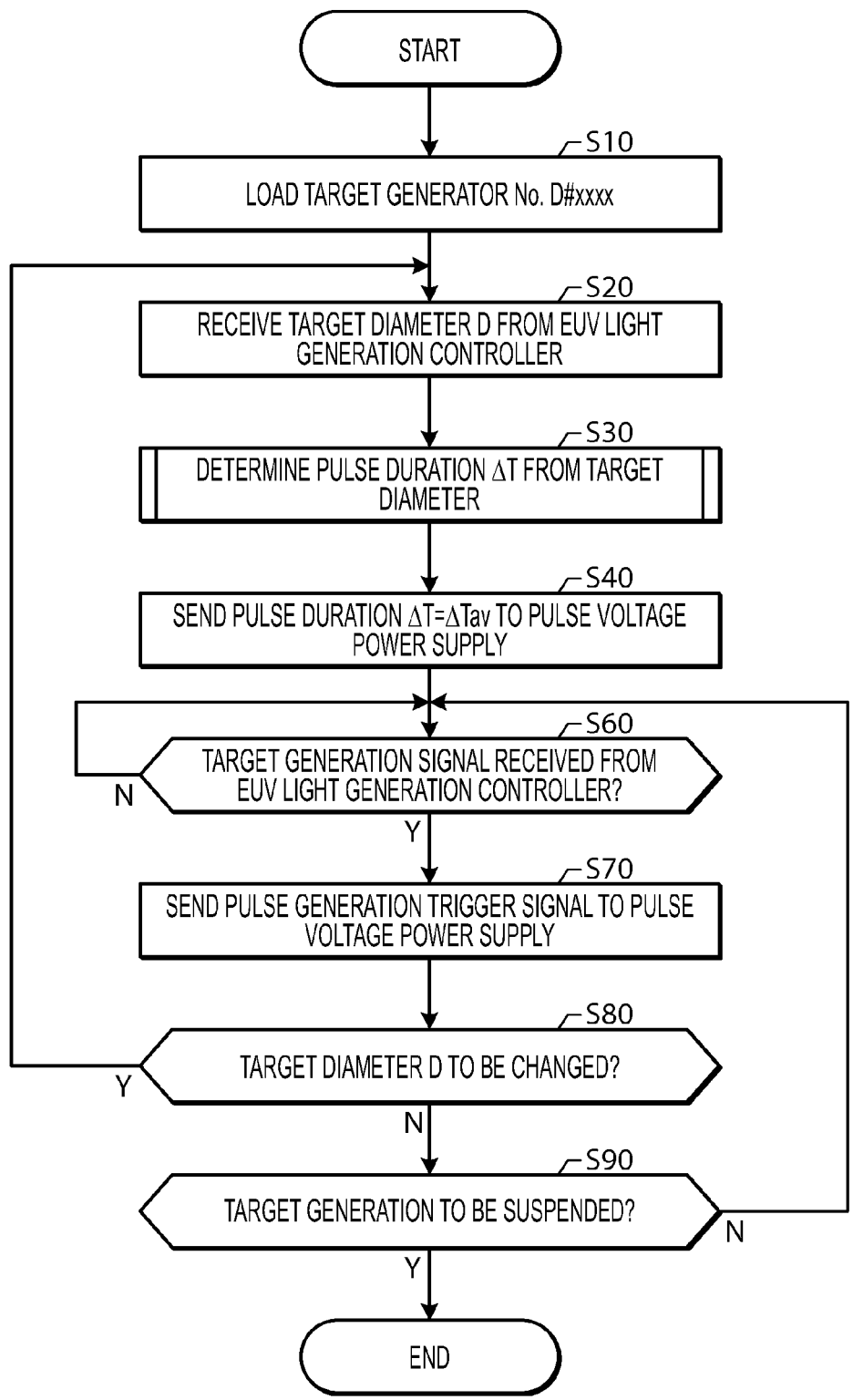
FIG. 11 is a flowchart showing an exemplary operation of a target controller of the third embodiment.

FIG. 11 is a flowchart showing an exemplary operation of a target controller of the third embodiment. The target controller 52 may control the pulse voltage power supply 58 based on data on a pulse duration with which a satellite 27a is suppressed through the following operation.

First, the target controller 52 may load a device number (e.g., D#xxxx) of the target generator 26 (Step S10). This device number may be inputted by an operator through an input device included in a user interface 1010, which will be described later, or may be stored in a storing unit such as a storage memory, which will be described later. The target controller 52 may then receive a signal from the EUV light generation controller 5 to specify a diameter D of a target 27 (Step S20).

Subsequently, the target controller 52 may determine a pulse duration $\Delta T$ with which a satellite 27a is suppressed based on the specified diameter D of the target 27 (Step S30). Details of Step S30 will be given later. Then, the target controller 52 may send data on an average value $\Delta Tav$ serving as a pulse duration $\Delta T$ to the pulse voltage power supply 58 (Step S40).

Thereafter, the target controller 52 may determine whether or not it has received a target generation signal from the EUV light generation controller 5 (Step S60). When a target generation signal is not received (Step S60; NO), the target controller 52 may stand by until it receives a target generation signal. When a target generation signal has been received (Step 60; YES), the target controller 52 may proceed to Step S70.

In Step S70, the target controller 52 may send a pulse generation trigger signal to the pulse voltage power supply 58. Then, the pulse voltage power supply 58 may generate a pulse voltage in accordance with the data on the pulse duration $\Delta T$ received in Step S40, and operate the target generator 26 accordingly.

Subsequently, the target controller 52 may determine whether or not to change a diameter D of a target 27 (Step S80). This determination may be made based on a control signal from the EUV light generation controller 5. When a diameter D of a target 27 is to be changed (Step S80;YES), the target controller 52 may return to Step S20 described above, and wait for a signal from the EUV light generation controller 5 specifying a diameter D of a target 27. When a diameter D of a target 27 is not to be changed (Step S80; NO), the target controller 52 may proceed to Step S90.

In Step S90, the target controller 52 may determine whether or not the generation of a target 27 is to be suspended. This determination may be made based on a control signal from the EUV light generation controller 5. When the generation of a target 27 is not to be suspended (Step S90; NO), the target controller 52 may return to Step S60 described above, and wait for a target generation signal from the EUV light generation controller 5. When the generation of a target 27 is to be suspended (S90;YES), the process in this flowchart may be terminated.

5.2.2 Determination of Pulse Duration (Details of Step S30)

Figure 12A:
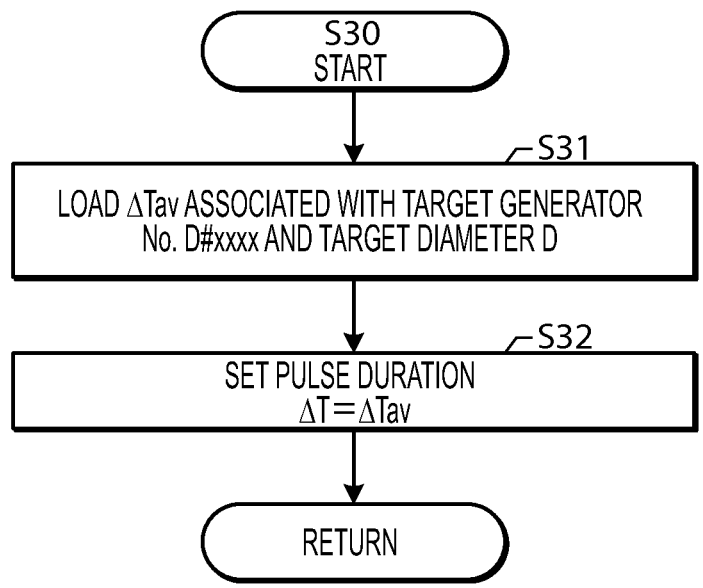
FIG. 12A is a flowchart showing an example of a pulse duration determination process shown in FIG. 11.

FIG. 12A is a flowchart showing an example of a pulse duration determination process shown in FIG. 11. The process shown in FIG. 12A may be carried out by the target controller 52 as a subroutine in Step S30 of FIG. 11. Here, a storing unit of the storage memory 1005 may hold, for each device number of the given target generator 26, the diameter D of the target 27 and the average value $\Delta Tav$ of the upper and lower limits of a range of the pulse duration $\Delta T$ with which a target 27 is generated but a satellite 27a is not observed in association with each other. Such data may be inputted to the storing unit of the storage memory 1005 online or through an appropriate storing medium. Alternatively, the data may be inputted manually by an operator.

The target controller 52 may first load from the storing unit of the storage memory 1005 data on an average value $\Delta Tav$ associated with the device number D#xxxx of the target generator 26 and the diameter D of the target 27 (Step S31). Subsequently, the target controller 52 may set the loaded average value $\Delta Tav$ in the pulse duration $\Delta T$ with which a satellite 27a is suppressed (Step S32). Then, the target controller 52 may proceed to Step S40.

Figure 12B:
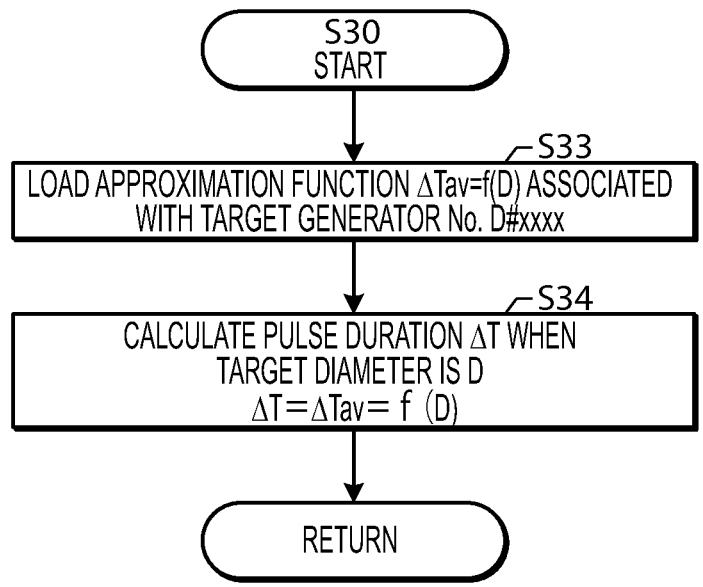
FIG. 12B is a flowchart showing another example of a pulse duration determination process shown in FIG. 11.

FIG. 12B is a flowchart showing another example of a pulse duration determination process shown in FIG. 11. The process shown in FIG. 12B may be carried out by the target controller 52 as a subroutine in Step S30 of FIG. 11. Here, the storing unit (not separately shown) may hold data on an approximation function ($\Delta Tav=f(D)$) for determining an average value $\Delta Tav$ using a diameter D of a target 27 associated with each device number of the given target generator 26.

The target controller 52 may first load from the storing unit of the storage memory 1005 data on an approximation function ($\Delta Tav=f(D)$) associated with the device number D#xxxx of the target generator 26 (Step S33).

Then, the target controller 52 may calculate an average value $\Delta Tav$ for the case where the diameter of the target 27 is D through the loaded approximation function (Step S34). Then, the target controller 52 may set the calculated average value $\Delta Tav$ in the pulse duration $\Delta T$ with which a satellite 27a is suppressed. Thereafter, the target controller 52 may proceed to Step S40.

Other points may be similar to those of the first embodiment. With the EUV light generation apparatus according to the third embodiment, a satellite 27a may be suppressed, and components in the chamber 2a may be prevented from being contaminated.

9. Configuration of Controller

Those skilled in the art will recognize that the subject matter described herein may be implemented by a general purpose computer or a programmable controller in combination with program modules or software applications. Generally, program modules include routines, programs, components, data structures, and so forth that can perform process as discussed in the present disclosure.

Figure 13:
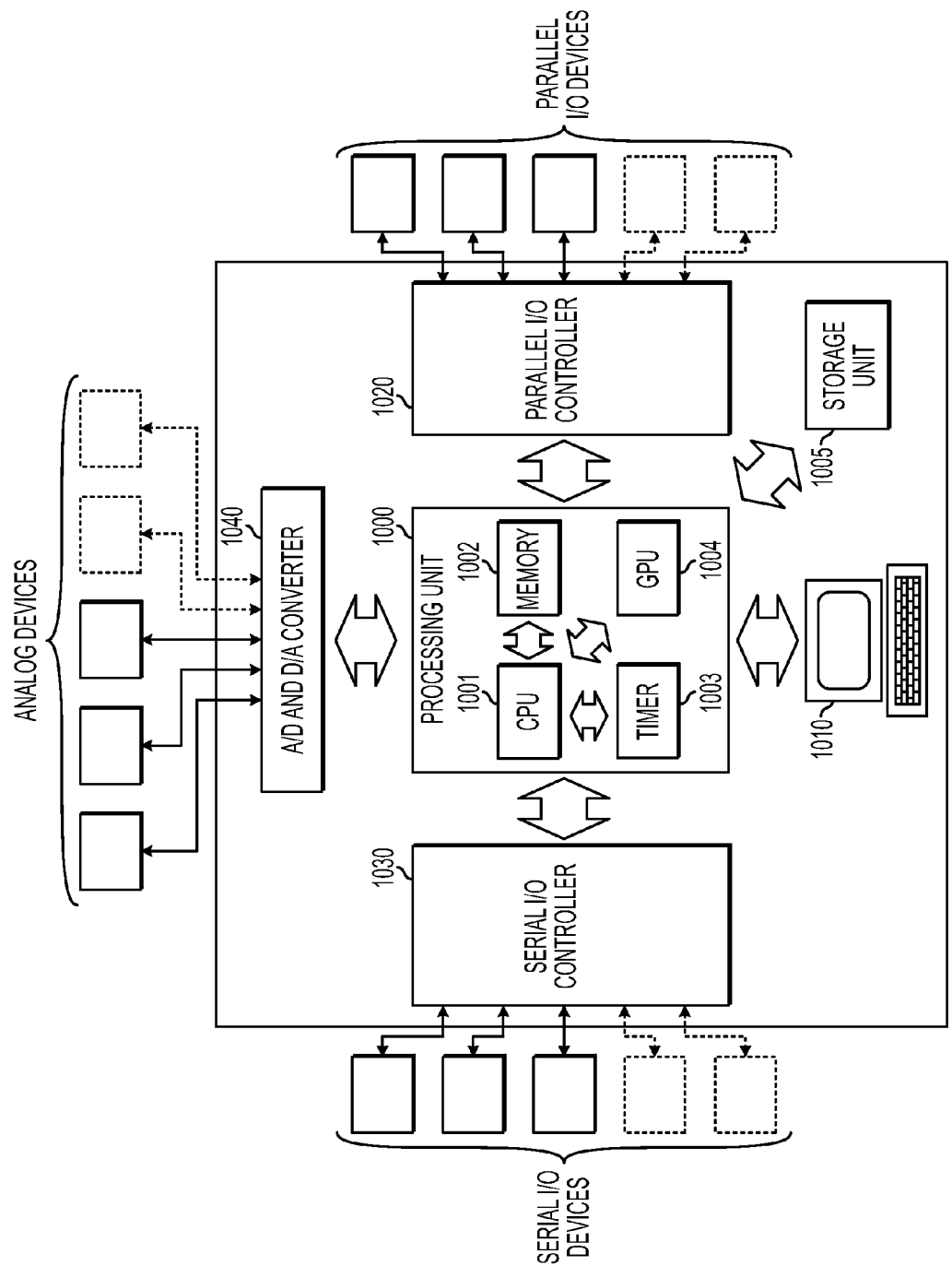
FIG. 13 is a block diagram illustrating an exemplary configuration of a controller.

FIG. 13 is a block diagram showing an exemplary hardware environment in which various aspects of the disclosed subject matter may be implemented. An exemplary environment 100 in FIG. 13 may include, but not limited to, a processing unit 1000, a storage unit 1005, a user interface 1010, a parallel input/output (I/O) controller 1020, a serial I/O controller 1030, and an analog-to-digital (A/D) and digital-to-analog (D/A) converter 1040.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any of various commercially available processors. Dual microprocessors and other multi-processor architectures may also be employed as the CPU 1001.

These components in FIG. 13 may be interconnected to one another to perform the processes discussed in the present disclosure.

In operation, the processing unit 1000 may load programs stored in the storage unit 1005 to execute them, read data from the storage unit 1005 in accordance with the programs, and write data in the storage unit 1005. The CPU 1001 may execute the programs loaded from the storage unit 1005. The memory 1002 may be a work area to temporally store programs to be executed by the CPU 1001 and data to be used for the operations of the CPU 1001. The timer 1003 may measure time intervals to provide the CPU 1001 with a measured result in accordance with the execution of the program. The GPU 1004 may process image data and provide the CPU 1001 with a processing result, in accordance with a program to be loaded from the storage unit 1005.

The parallel I/O controller 1020 may be coupled to parallel I/O devices such as the imaging unit 72 and the EUV light generation controller 5, which can communicate with the processing unit 1000, and control communication between the processing unit 1000 and those parallel I/O devices. The serial I/O controller 1030 may be coupled to serial I/O devices such as the DC voltage power supply 57, the pressure adjuster 53, the pulse voltage power supply 58, the heater power supply 67a, and the imaging unit 72, which can communicate with the processing unit 1000, and control communication between the processing unit 1000 and those serial I/O devices. The A/D and D/A converter 1040 may be coupled to analog devices such as rge temperature sensor 68 and the pressure sensor 69, through analog ports.

The user interface 1010 may display progress of executing programs by the processing unit 1000 for an operator so that the operator can instruct the processing unit 1000 to stop execution of the programs or to execute an interruption routine.

The exemplary environment 100 can be applicable to implement each of the EUV light generation controller 5 and the target controller 52 in the present disclosure. Persons skilled in the art will appreciate that those controllers can be implemented in distributed computing environments where tasks are performed by processing units that are linked through any type of a communications network. As discussed in the present disclosure, the EUV light generation controller 5 and the target controller can be connected to each other through a communication network such as Ethernet. In a distributed computing environment, program modules may be located in both local and remote memory storage devices.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A target generation device, comprising:
   a target generator configured to be driven by a pulse voltage to generate a droplet of a target material;
   a detector configured to detect a target generated by the target generator and output a detection signal indicative of a detection result; and
   a controller configured to, responsive to the detection signal:
      determine whether or not a target is generated by the target generator based on the detection signal, and
      determine whether or not the generated target includes a plurality of droplets, and
      control a pulse duration of the pulse voltage for driving the target generator when the generated target includes the plurality of droplets.

2. The target generation device according to claim 1, wherein the detector includes:
   a light source for illuminating the target; and
   an imaging unit for capturing an image of the illuminated target.

3. The target generation device according to claim 1, further comprising:
   a storing unit for storing ID information for identifying the target generator, and pulse information on the pulse duration for driving the target generator, the ID information being associated with the pulse information,
   wherein the controller is further configured to:
      receive an input of the ID information,
      obtain, based on the ID information, the pulse information by searching the storing unit, and
      control, based on the obtained pulse information, the pulse duration for driving the target generator.

4. The target generation device according to claim 3, wherein
   the storing unit stores the pulse information as a function of diameter information pertaining to a diameter of a target, and
   the controller further receives information on a diameter of a target and calculates the pulse duration based on the function and the diameter information.

* * * * *